(12) United States Patent
Iwata et al.

(10) Patent No.: US 9,129,999 B2
(45) Date of Patent: Sep. 8, 2015

(54) TREATMENT DEVICE, TREATMENT METHOD, AND SURFACE TREATMENT JIG

(75) Inventors: Yasumasa Iwata, Kawasaki (JP); Akihiko Nakamura, Kawasaki (JP)

(73) Assignee: Tokyo Ohka Kogyo Co., Ltd., Kanagawa (JP)

(*) Notice: Subject to any disclaimer, the term of this patent is extended or adjusted under 35 U.S.C. 154(b) by 569 days.

(21) Appl. No.: 12/514,193

(22) PCT Filed: Oct. 12, 2007

(86) PCT No.: PCT/JP2007/069961
§ 371 (c)(1),
(2), (4) Date: May 8, 2009

(87) PCT Pub. No.: WO2008/065820
PCT Pub. Date: Jun. 5, 2008

(65) Prior Publication Data
US 2010/0037916 A1 Feb. 18, 2010

(30) Foreign Application Priority Data
Nov. 30, 2006 (JP) .................... 2006-324433

(51) Int. Cl.
*B08B 3/04* (2006.01)
*H01L 21/67* (2006.01)
*H01L 21/02* (2006.01)

(52) U.S. Cl.
CPC ...... *H01L 21/6708* (2013.01); *H01L 21/02057* (2013.01)

(58) Field of Classification Search
CPC .................................................. H01L 21/6708
See application file for complete search history.

(56) References Cited

U.S. PATENT DOCUMENTS

| 6,488,040 B1 | 12/2002 | de Larios et al. |
| 7,069,937 B2 * | 7/2006 | Garcia et al. ........... 134/199 |

(Continued)

FOREIGN PATENT DOCUMENTS

| EP | 1 076 356 A2 | 2/2001 |
| JP | 63-110730 | 5/1988 |

(Continued)

OTHER PUBLICATIONS

International Search Report for corresponding application No. PCT/JP2007/069961 completed Dec. 6, 2007.

(Continued)

*Primary Examiner* — Michael Barr
*Assistant Examiner* — Jason Riggleman
(74) *Attorney, Agent, or Firm* — Renner, Otto, Boisselle & Sklar, LLP

(57) ABSTRACT

The treatment device 100 of the present invention is a treatment device for carrying out treatment to a treatment object 18 whose treatment surface includes a second treatment surface 18*b* and a first treatment surface 18*a* surrounding the second treatment surface 18*b*, the treatment device including: a table section 10 for placing the treatment object 18 thereon; and a first feeding section 24 for feeding a first treatment liquid to an approximate boundary between the first and the second treatment surfaces 18*a*, 18*b* and a second feeding section 46 for feeding a second treatment liquid to the second treatment surface 18*b*. Thus, the present invention provides a treatment device, a treatment method, and a surface treatment jig, each of the treatment device and the treatment method being capable of carrying out independent treatments to a treatment surface and an exposed surface surrounding the treatment surface, respectively.

7 Claims, 7 Drawing Sheets

(56) References Cited

U.S. PATENT DOCUMENTS

| | | |
|---|---|---|
| 7,191,787 B1 | 3/2007 | Redeker et al. |
| 7,297,190 B1 | 11/2007 | Dordi et al. |
| 7,367,345 B1 | 5/2008 | Hemker et al. |
| 7,584,761 B1 | 9/2009 | Yun et al. |
| 7,632,376 B1 | 12/2009 | Ravkin et al. |
| 7,806,126 B1 | 10/2010 | Mikhaylichenko et al. |
| 7,810,513 B1 | 10/2010 | Boyd et al. |
| 2003/0075204 A1 | 4/2003 | de Larios et al. |
| 2004/0060195 A1 | 4/2004 | Garcia et al. |
| 2004/0060573 A1 | 4/2004 | Woods |
| 2004/0060580 A1 | 4/2004 | Woods |
| 2004/0060581 A1 | 4/2004 | Garcia et al. |
| 2004/0069319 A1 | 4/2004 | Boyd et al. |
| 2004/0069326 A1 | 4/2004 | Woods et al. |
| 2004/0069329 A1 | 4/2004 | de Larios et al. |
| 2004/0178060 A1 | 9/2004 | Ravkin et al. |
| 2004/0182422 A1 | 9/2004 | Boyd et al. |
| 2004/0226654 A1* | 11/2004 | Hongo et al. ............ 156/345.11 |
| 2005/0067000 A1* | 3/2005 | Kosugi ............................ 134/18 |
| 2005/0139318 A1 | 6/2005 | Woods et al. |
| 2005/0145265 A1 | 7/2005 | Ravkin et al. |
| 2005/0145267 A1 | 7/2005 | Korolik et al. |
| 2005/0145268 A1 | 7/2005 | Woods |
| 2005/0148197 A1 | 7/2005 | Woods et al. |
| 2005/0155629 A1 | 7/2005 | Ravkin et al. |
| 2005/0158473 A1 | 7/2005 | Raykin et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0284767 A1 | 12/2005 | Dordi et al. |
| 2006/0005860 A1 | 1/2006 | Garcia |
| 2006/0067682 A1 | 3/2006 | Kaneyama et al. |
| 2006/0081270 A1 | 4/2006 | Woods et al. |
| 2006/0088982 A1 | 4/2006 | Boyd et al. |
| 2006/0124153 A1 | 6/2006 | Yun et al. |
| 2006/0150435 A1 | 7/2006 | Garcia et al. |
| 2006/0191560 A1 | 8/2006 | Ravkin et al. |
| 2006/0207636 A1 | 9/2006 | Garcia et al. |
| 2006/0254078 A1 | 11/2006 | O'Donnell |
| 2006/0260932 A1 | 11/2006 | Ravkin et al. |
| 2006/0269877 A1 | 11/2006 | Boyd et al. |
| 2007/0011905 A1 | 1/2007 | Garcia et al. |
| 2007/0023070 A1 | 2/2007 | Woods et al. |
| 2007/0048447 A1 | 3/2007 | Lee et al. |
| 2007/0107756 A1 | 5/2007 | Woods et al. |
| 2007/0119477 A1 | 5/2007 | Redecker et al. |
| 2007/0218653 A1 | 9/2007 | de Larios et al. |
| 2007/0235409 A1 | 10/2007 | Woods et al. |
| 2007/0240737 A1 | 10/2007 | Zhu et al. |
| 2007/0261594 A1 | 11/2007 | Vaskelis et al. |
| 2007/0264436 A1 | 11/2007 | Dordi et al. |
| 2007/0292603 A1 | 12/2007 | Doridi et al. |
| 2007/0292604 A1 | 12/2007 | Dordi et al. |
| 2007/0292615 A1 | 12/2007 | Dordi et al. |
| 2008/0006307 A1 | 1/2008 | Woods et al. |
| 2008/0057182 A1 | 3/2008 | Boyd et al. |
| 2008/0057198 A1 | 3/2008 | Yoon et al. |
| 2008/0057221 A1 | 3/2008 | Boyd et al. |
| 2008/0105653 A1* | 5/2008 | Seah et al. ...................... 216/92 |
| 2008/0146025 A1 | 6/2008 | Dordi et al. |
| 2008/0169008 A1 | 7/2008 | Yun et al. |
| 2008/0171292 A1 | 7/2008 | Hemker et al. |
| 2008/0230097 A1 | 9/2008 | Ravkin et al. |
| 2008/0260940 A1 | 10/2008 | Yoon et al. |
| 2008/0260963 A1 | 10/2008 | Yoon et al. |
| 2008/0260967 A1 | 10/2008 | Yoon et al. |
| 2008/0266367 A1 | 10/2008 | Ravkin et al. |
| 2009/0095198 A1 | 4/2009 | Norkus et al. |
| 2009/0151753 A1 | 6/2009 | Woods |
| 2009/0173718 A1 | 7/2009 | Yun et al. |
| 2009/0176360 A1 | 7/2009 | Garcia |
| 2009/0304914 A1 | 12/2009 | Nalla et al. |
| 2009/0320749 A1 | 12/2009 | Yoon et al. |
| 2009/0320884 A1 | 12/2009 | Korolik et al. |
| 2010/0009535 A1 | 1/2010 | Dordi et al. |
| 2010/0071730 A1 | 3/2010 | Ravkin et al. |
| 2010/0108652 A1 | 5/2010 | Boyd et al. |
| 2010/0170803 A1 | 7/2010 | Dordi et al. |
| 2010/0239767 A1 | 9/2010 | Dordi et al. |
| 2010/0313443 A1 | 12/2010 | Mikhaylichenko et al. |
| 2010/0319726 A1 | 12/2010 | Boyd et al. |
| 2011/0155563 A1 | 6/2011 | Ravkin et al. |
| 2011/0265823 A1 | 11/2011 | Ravkin et al. |
| 2012/0152147 A1 | 6/2012 | Norkus et al. |
| 2012/0269987 A1 | 10/2012 | Dordi et al. |

FOREIGN PATENT DOCUMENTS

| | | |
|---|---|---|
| JP | 08-274052 A | 10/1996 |
| JP | 11-233406 | 8/1999 |
| JP | 2001-053046 A | 2/2001 |
| JP | 2002-177854 | 6/2002 |
| JP | 2004-221244 A | 8/2004 |
| JP | 2005-174961 A | 6/2005 |
| JP | 2006-041504 A | 2/2006 |
| JP | 2006-210580 | 8/2006 |

OTHER PUBLICATIONS

Japanese Office Action for corresponding Japanese Application No. 2011-092158 mailed Sep. 4, 2012.

Japanese Office Action for related Japanese Application No. 2011-092158 mailed Mar. 12, 2013.

* cited by examiner

TREATMENT DEVICE, TREATMENT METHOD, AND SURFACE TREATMENT JIG

TECHNICAL FIELD

The present invention relates to a treatment device, a treatment method, and a surface treatment jig, each of the treatment device and the treatment method treating a surface of a treatment object with a treatment liquid.

BACKGROUND ART

There is a demand for a thinned, downsized, and lightened IC card or mobile phone. In order that such a demand is met, a semiconductor chip to be built in the IC card or the mobile phone needs to be a thinned semiconductor chip. However, a semiconductor wafer constituting a modern semiconductor chip has a thickness (a film thickness) falling in a range from 125 µm to 150 µm. In this view, it has been said that a semiconductor wafer for constituting a next generation chip needs to have a thickness falling in a rage from 25 µm to 50 µm.

One example of a method for manufacturing a semiconductor wafer having such a film thickness may include a thinning method described below. At first, the thinning method includes combining a semiconductor wafer and a plate material, such as a support plate or the like, to each other via a tape that includes an adhesive layer in each side or via an adhesive agent. The support plate to be used in the thinning plate serves to strengthen the semiconductor wafer after it has been thinned. Subsequently, the thinning method includes grinding the semiconductor wafer by a grinder or the like in a state that the semiconductor wafer and the support plate have been combined to each other, so that a thinned semiconductor wafer is manufactured. Finally, the thinning method includes removing the support plate from the thinned semiconductor wafer.

SUMMARY OF INVENTION

However, in a case where the aforementioned thinning method combines the support plate and the semiconductor wafer via the adhesive agent, a residual of the adhesive agent may be left on the semiconductor wafer after the support plate has been removed from the semiconductor wafer. As such, a top of the semiconductor wafer needs to be cleaned by removing the residual of the adhesive agent. Usually, the thinned semiconductor wafer is diced, and separated into individual chips, in a state that it has been attached on the dicing tape fixed to the dicing frame. After the thinned semiconductor wafer, to which the support plate has been adhered, is attached to the dicing tape, removal of the support plate and that of the adhesive agent left on the semiconductor wafer may be carried out. Usually, the dicing tape to be used has a surface area that is larger than the semiconductor wafer, and as such, a surface of the dicing tape is exposed around the semiconductor wafer. In this view, in a case where such a semiconductor wafer is treated based on a method that includes a step of dropping a treatment liquid (a solvent) to a rotating treatment object or treated with ordinary cleansing treatment that immerses a semiconductor wafer in a treatment liquid, the exposed surface of the dicing tape is treated with the treatment liquid. That is, even though it is intended to treat only a surface of the semiconductor wafer with such cleansing treatment, the exposed surface of the dicing tape surrounding the semiconductor wafer is also treated with the cleansing treatment. Since a deterioration of the dicing tape may be caused by some treatment liquids, development of a method that removing the adhesive agent on the semiconductor wafer while protecting the dicing tape is desired.

The present invention is made in view of the problem, and an object of the invention is to provide a treatment device, a treatment method, and a surface treatment jig, each of the treatment device and the treatment method being capable of carrying out independent treatments to a treatment surface and an exposed surface surrounding the treatment surface, respectively.

The treatment device of the present invention is a treatment device for carrying out treatment to a treatment object whose treatment surface includes a second treatment surface and a first treatment surface surrounding the second treatment surface, the treatment device including a table section for placing the treatment object thereon; and a treatment jig that includes a first feeding section for feeding a first treatment liquid to an approximate boundary between the first and the second treatment surfaces, and a second feeding section for feeding a second treatment liquid to the second treatment surface.

The treatment device of the present invention includes the treatment jig that includes the first feeding section for feeding the first treatment liquid to the approximate boundary between the first and the second treatment surfaces, and the second feeding section for feeding the second treatment liquid to the second treatment surface. The first treatment liquid thus fed to the approximate boundary cover the first treatment surface and thereby protects it. As such, even when the second treatment liquid having been fed to the second treatment surface reaches the first treatment surface, influence of the second treatment liquid on the first treatment surface can be reduced. That is, in a state that the influence of the second treatment liquid on the first treatment surface is reduced, it is possible that the second treatment surface be treated with desired treatment. Thus, even with respect to the treatment object including plural treatment surfaces for each of which an independent treatment condition is required, the treatment device of the present invention makes it possible to provide a treatment device capable of treating each of the first and the second treatment surfaces with treatment that satisfies the treatment condition.

In the present invention, the "approximate boundary" refers to a boundary between the first and the second treatment surfaces and a region around the boundary.

It is preferable that the treatment device of the present invention be arranged such that the table section includes rotation means for rotating the treatment object. This makes it possible to outwardly spread the first and the second treatment liquids toward the outer edge of the treatment object by a centrifugal force, thereby making it possible to treat the treatment object with high efficiency.

It is preferable that the treatment device of the present invention further include a preparation treatment jig for carrying out treatment to the second treatment surface. According to the aspect, the preparation treatment is carried out such that the second treatment surface can be cleaner.

It is preferable that the treatment device of the present invention be arranged such that the preparation treatment jig includes a treatment section, the treatment section (i) including a facing surface that faces the second treatment surface, (ii) retaining the preparation treatment liquid, which has been fed by feeding means, between the facing surface and the second treatment surface and thereby carrying out treatment to the second treatment surface, and (iii) being supported by separation maintaining means so as to be held separately from the second treatment surface. According to the aspect, the treatment device includes the preparation treatment jig capable of feeding the preparation treatment liquid to the second treatment surface and collecting the preparation treatment liquid thus fed, while being held separately from the second treatment surface. This makes it possible that the preparation treatment liquid be retained only between the second treatment surface and the facing surface that faces the second treatment surface, and thereby possible that the second treatment surface be treated with the preparation treatment in a state that the second treatment liquid is prevented from spattering on a region other than the second treatment surface.

The treatment method of the present invention is a treatment method for carrying out treatment to the treatment object whose treatment surface includes the second treatment surface and the first treatment surface surrounding the second treatment surface, the treatment method including: a first treatment step including feeding the second treatment liquid to the second treatment surface under rotation of the treatment object while feeding the first treatment liquid to the approximate boundary between the first and the second treatment surfaces under the rotation of the treatment object.

As such, the fed first treatment liquid is outwardly spread from the approximate boundary due to the centrifugal force by the rotation of the treatment object, so that the first treatment surface is covered by the first treatment liquid. At the same time, the second treatment liquid thus fed to the second treatment surface is spread from a position to which it has been fed toward an entire surface of the treatment object. Because the first treatment surface has been protected by the first treatment liquid, as described above, the influence of the second treatment liquid thus spread is reduced. As such, the treatment method of the present invention makes it possible to carry out good treatment to the treatment object including plural treatment surfaces for each of which the independent treatment condition is required.

It is preferable that the treatment method of the present invention be arranged such that the first treatment step includes feeding the second treatment liquid to the second treatment surface after the first treatment surface is covered by the first treatment liquid. According to the aspect, it is possible that the first treatment surface is protected with certainty.

It is preferable that the treatment method of the present invention be arranged such that the first treatment step includes feeding a third treatment liquid to the second treatment surface after feeding of the second treatment liquid is stopped. According to the aspect, in a case where the treatment liquid having a higher volatility than the second treatment liquid is used as the third treatment liquid, dehydration of the treatment object can be improved.

It is preferable that the treatment method of the present invention be arranged such that the first treatment step includes the step of continuing feeding the first treatment liquid under the rotation of the treatment object even after feeding of the second treatment liquid and/or the third treatment liquid is stopped. According to the aspect, it is possible that the first treatment surface be protected with certainty. A residual of the second treatment liquid and/or the third treatment liquid may be left on the second treatment surface after the feeding of the second treatment liquid and/or the third treatment liquid is stopped. However, the treatment method of the present invention continues feeding the first treatment liquid after the feeding of the second treatment liquid and/or the third treatment liquid is stopped, and thereby makes it possible to prevent the residual of the second treatment liquid and/or the third treatment liquid from being in direct contact with the first treatment surface.

It is preferable that the treatment method of the present invention include the step of continuing the rotation of the treatment object even after the feeding of the first treatment liquid to the first treatment surface is stopped. According to the aspect, the treatment object can be dehydrated with certainty.

It is preferable that the treatment method of the present invention include a preparation treatment step before the first treatment step, the preparation treatment step including treating the second treatment surface with the preparation treatment liquid. According to the aspect, it is possible that the second treatment surface be cleaner.

It is preferable that the treatment method of the present invention be arranged such that the preparation treatment step includes the steps of: providing a surface treatment jig including a treatment section, the treatment section (i) being held separately from the second treatment surface, (ii) including a facing surface that faces the second treatment surface, and (iii) retaining, between the facing surface and the second treatment surface, the preparation treatment liquid that is fed to the surface treatment jig; feeding the preparation treatment liquid to the surface treatment jig and collecting the thus fed preparation treatment liquid; and treating the second treatment surface with the preparation treatment liquid by use of the surface treatment jig in such a manner that the preparation treatment liquid will not be spattered from the surface treatment jig.

According to the aspect, in a case where the second treatment surface needs to be treated more as compared to the first treatment surface, it is possible that the second treatment surface be treated with the preparation treatment by use of the preparation treatment jig. This makes it possible to realize effective treatment.

The surface treatment jig of the present invention is a surface treatment jig for use in treating a treatment object with the treatment liquid, a treatment surface of the treatment object including the second treatment surface and the first treatment surface surrounding the second treatment surface, the surface treatment jig including: the first feeding section for feeding the first treatment liquid to the approximate boundary between the first and the second treatment surfaces; and the second feeding section for feeding the second treatment liquid to the second treatment surface.

The surface treatment jig of the present invention can include the first feeding section for feeding the first treatment liquid to the boundary between the first and the second treatment surfaces, and the second feeding section for feeding the second treatment liquid to the second treatment surface. This makes it possible to carry out good treatment to the treatment object including the first and the second treatment surfaces for each of which independent treatment is required.

For a fuller understanding of the nature and advantages of the invention, reference should be made to the ensuing detailed description taken in conjunction with the accompanying drawings.

Figure 1:
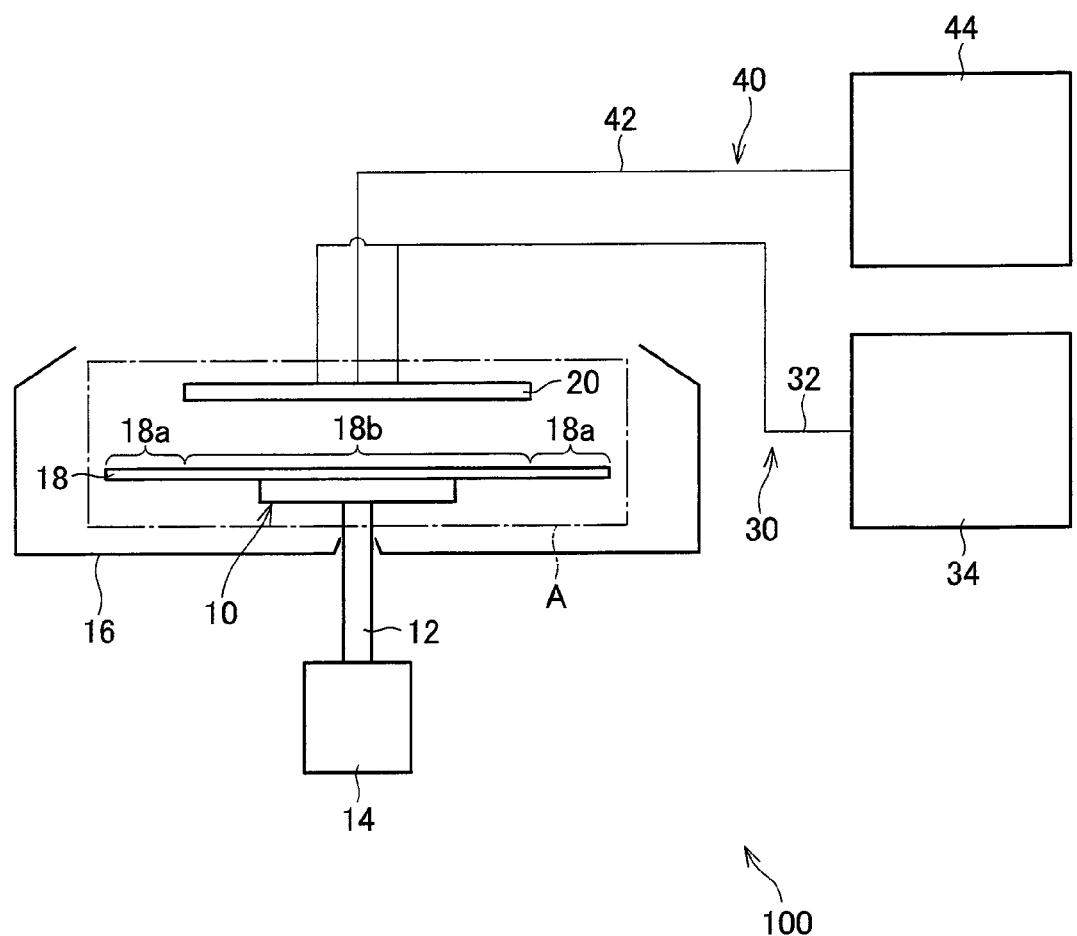
FIG. 1 is a cross sectional view showing a main part of a treatment device in accordance with the present embodiment.
Figure 2:
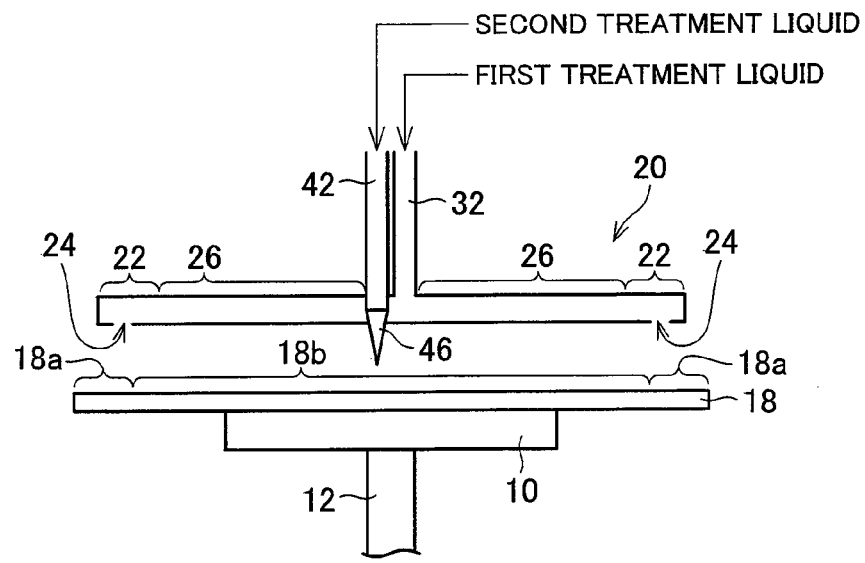
Figure 2:
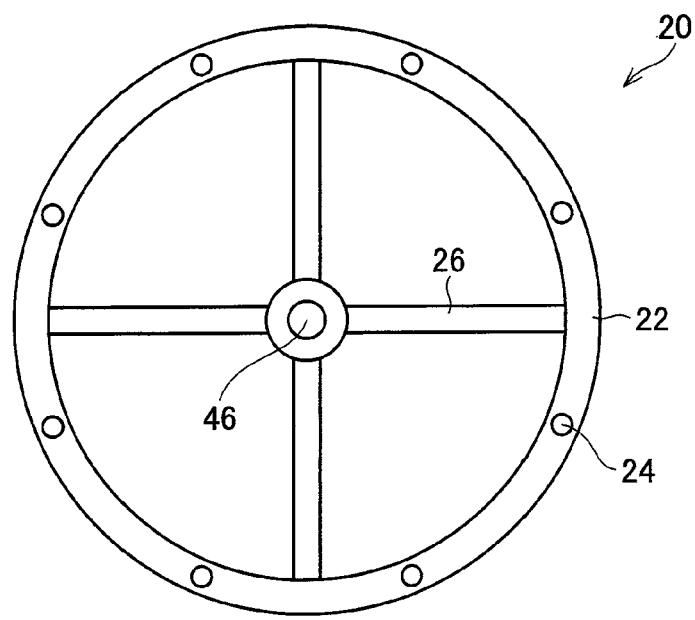

(a) of FIG. 2 is a cross sectional view showing a section A in FIG. 1 in more detail.

(b) of FIG. 2 is a plane view showing a treatment jig.

Figure 3:
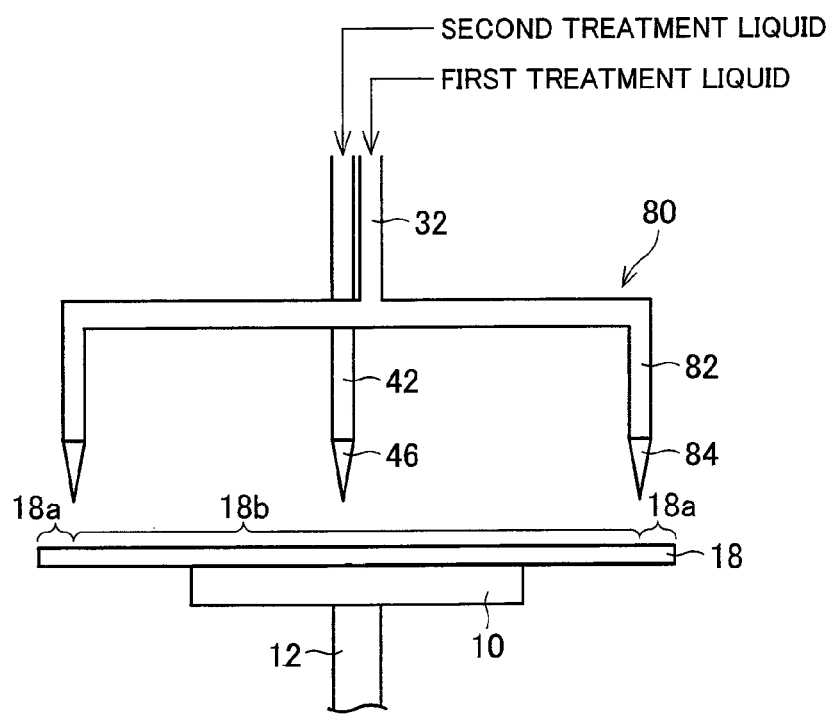
Figure 3:
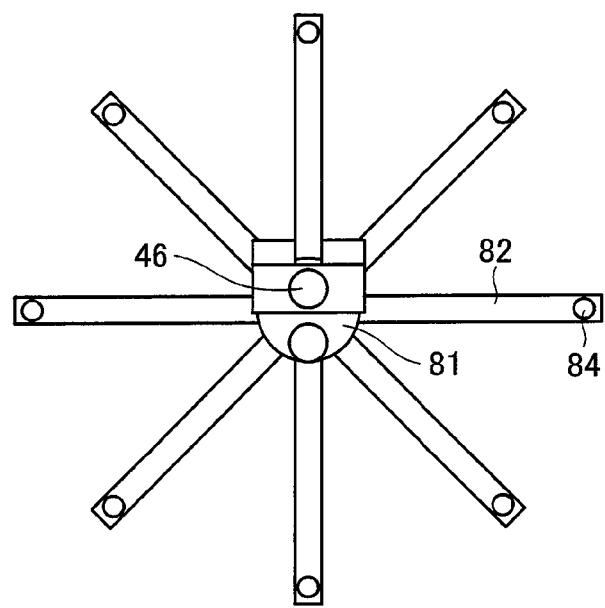

(a) of FIG. 3 is a cross sectional view showing, in detail, a treatment jig in accordance with another embodiment.

(b) of FIG. 3 is a plane view showing the treatment jig.

Figure 4:
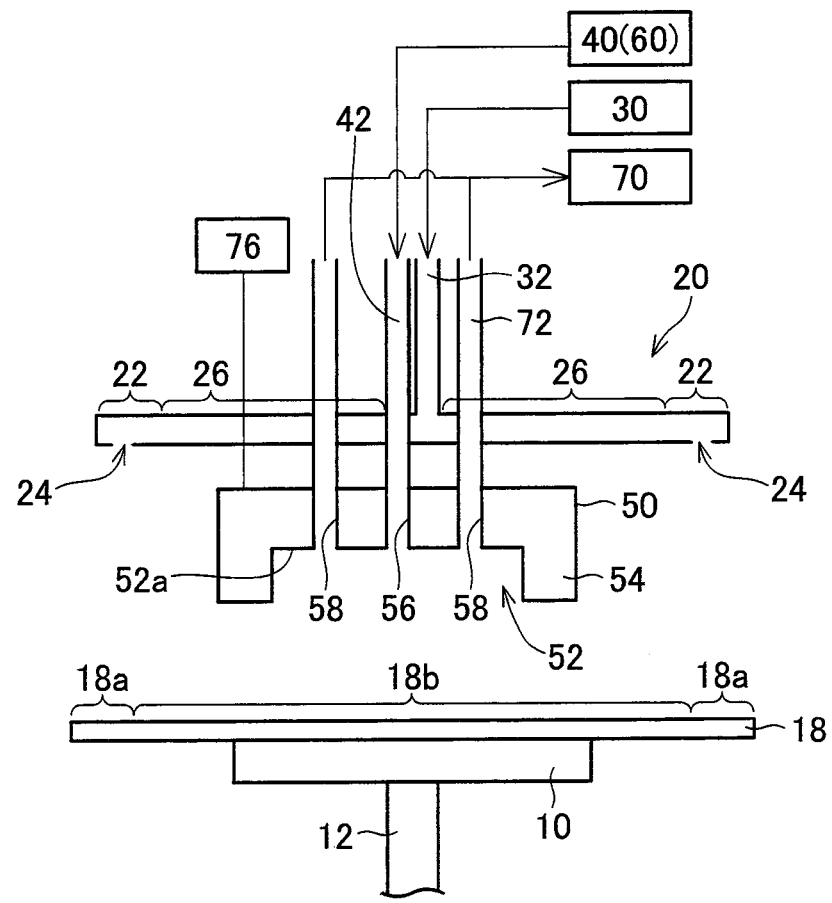

FIG. 4 is a cross sectional view showing, in more detail, a preparation treatment jig for use in a treatment jig of the present embodiment.

Figure 5:
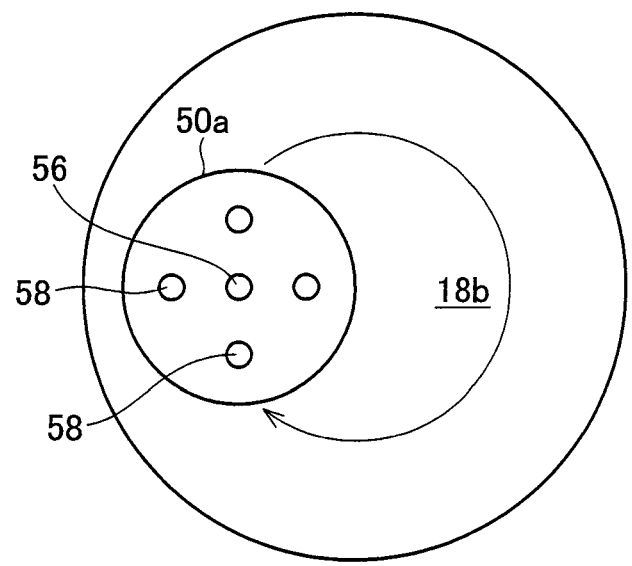
Figure 5:
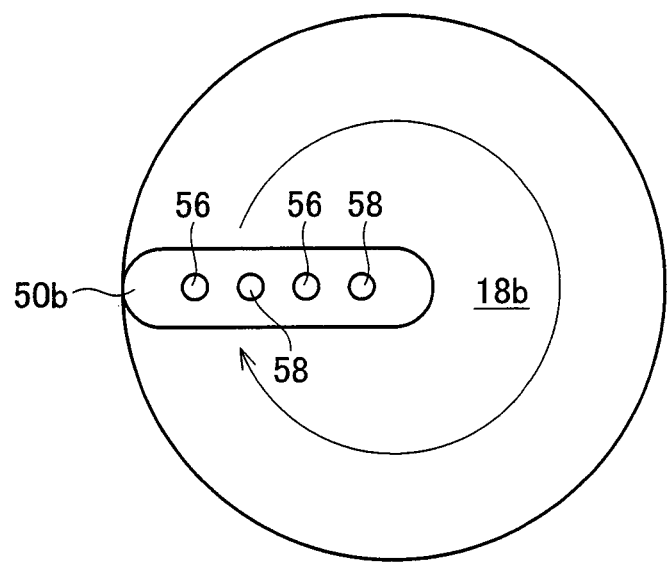

(a) of FIG. 5 is a plane view showing a cross sectional shape of a preparation treatment jig in accordance with a first aspect.

(b) of FIG. 5 is a plane view showing a cross sectional shape of a preparation treatment jig in accordance with a second aspect.

Figure 6:
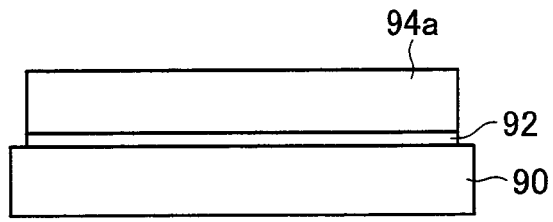
Figure 6:
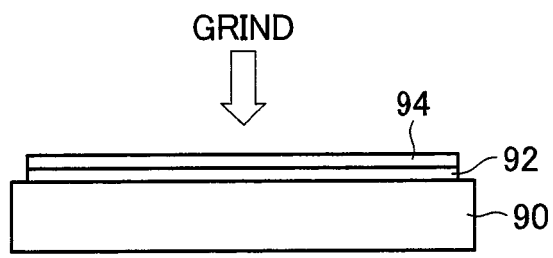
Figure 6:
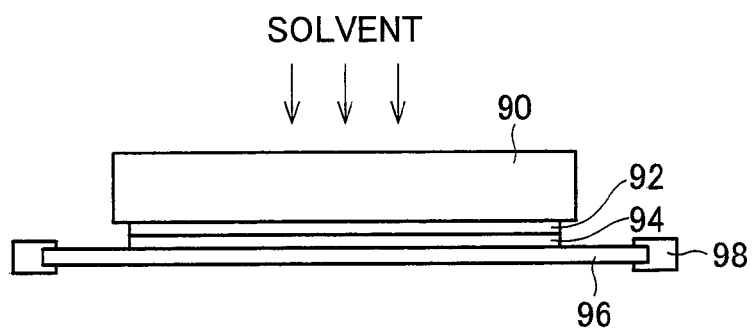
Figure 6:
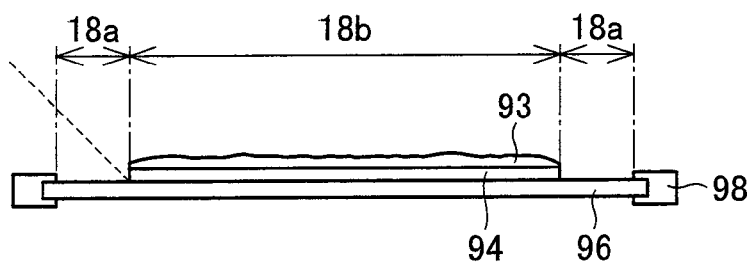

(a) of FIG. 6 is a cross sectional view showing one example of a treatment object that is treated by use of the treatment device of the present embodiment.

(b) of FIG. 6 is a cross sectional view showing the example of the treatment object that is treated by the use of the treatment device of the present embodiment.

(c) of FIG. 6 is a cross sectional view showing the example of the treatment object that is treated by the use of the treatment device of the present embodiment.

(d) of FIG. 6 is a cross sectional view showing the example of the treatment object that is treated by the use of the treatment device of the present embodiment.

Figure 7:
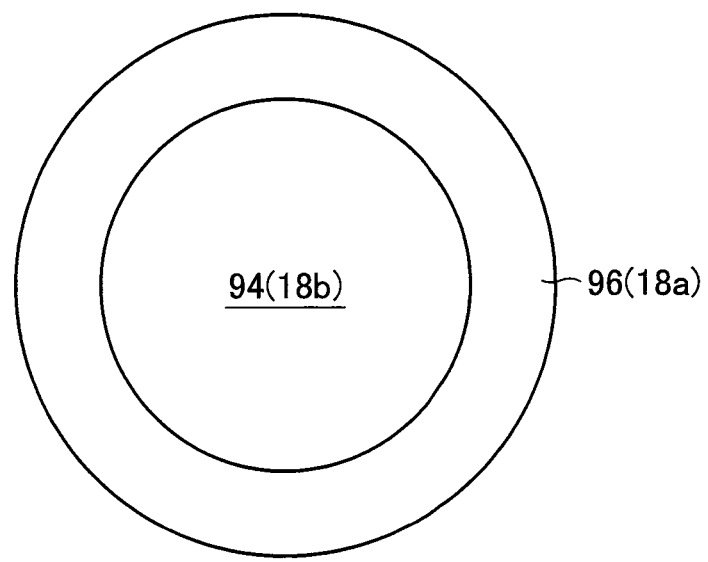

FIG. 7 is a plane view showing one example of the treatment object that is treated by the use of the treatment device of the present embodiment.

REFERENCE SIGNS LIST

10. Table section
12. Rotating shaft
14. Motor
16. Cleansing tub
18. Treatment object
18a. First treatment surface
18b. Second treatment surface
20, 80. Treatment jig
22, 82. Tube
24, 84. Feeding opening (First feeding section)
30. First feeding means
32, 42. Feeding pipe
34, 44. Tank
40. Second feeding means
46. Nozzle (Second feeding section)
50, 50a, 50b. Preparation treatment jig (Surface treatment jig)
52. Treatment section
52a. Facing surface
54. Protrusion section
56. First through hole
58. Second through hole
60. Feeding means
70. Collection means
100, 110. Treatment device

DESCRIPTION OF EMBODIMENTS

One embodiment of the present invention is described below with reference to the attached drawings.

(Treatment Device)

First, a treatment device 100 of the present embodiment is described with reference to the drawings. FIG. 1 is a cross sectional view showing a main part of the treatment device 100 of the present embodiment. (a) of FIG. 2 is a cross sectional view showing a part A in FIG. 1 in more detail. (b) of FIG. 2 is a plane view showing, from the treatment object, a treatment jig included by the treatment device 100. The present embodiment deals with a case where the treatment object has a circular shape.

The treatment device 100 of the present embodiment carries out treatment to a treatment object 18 including a second treatment surface 18b and a first treatment surface 18a surrounding the second treatment surface 18b. The treatment device 100 includes a table section 10 for placing the treatment object 18 thereon, and a treatment jig 20 for treating the treatment object with a treatment liquid. The treatment jig 20 includes a first feeding section for feeding the treatment liquid to an approximate boundary between the first and the second treatment surfaces 18a, 18b, and a second feeding section for feeding a second treatment liquid to the second treatment surface 18b. The approximate boundary refers to a boundary between the first and the second treatment surfaces 18a, 18b, and a region near the boundary. The treatment device 100 further includes a cleansing cup 16 that is provided so as to surround the table section 10 and the treatment object 18.

The table section is capable of holding the treatment object 18 by, for example, suction. The table section 10 is provided on a rotating shaft 12 that is capable of rotating around a normal line passing through a center of the table section 10. The rotating shaft 12 is attached to a motor 14 that rotates the rotating shaft 12.

The treatment jig 20 is connected with first feeding means 30 for feeding a first treatment liquid to the treatment jig 20 and second feeding means 40 for feeding a second treatment liquid to the treatment jig 20. The first treatment means 30 includes members such as a tank 34 that contains the first treatment liquid, a feeding pipe 32 connected with the tank 34 at one end, and the like. The feeding pipe 32 is connected with the treatment jig 20 at the other end. The second feeding means 40, likewise, includes members such as a tank 44 that contains the second treatment liquid, a feeding pipe 42 connected with the tank 44 at one end, and the like. The feeding pipe 42 is connected with the treatment jig 20 at the other end.

Next, a concrete arrangement of the treatment jig 20 is explained with reference to FIG. 2. As shown in (a) and (b) of FIG. 2, the treatment jig 20 includes a tube 20 of an annular shape for feeding the first treatment liquid to the treatment object 18, and a nozzle 46 for feeding the second treatment liquid to the treatment object 18. The tube 22 is in communication with the feeding pipe 32. As shown in (b) of FIG. 2, a feeding opening 24 is formed in the tube 22 at such a position so as to face the treatment object 18. Via the feeding opening 24, the first treatment liquid is fed to the approximate boundary between the first and the second treatment surfaces 18a, 18b. The feeding opening can be realized by a hole formed in the tube 22 or a nozzle (which is not illustrated) provided to the tube 22. (b) of FIG. 2 shows an arrangement in which a feeding opening 24 is realized by the hole formed in a tube 22.

In the present embodiment, the treatment jig 20 having plural feeding openings 24 is illustrated. The number of the feeding openings 24 can be determined as appropriate based on a size of the second treatment surface 18b. In a case where plural feeding openings 24 are formed, it is preferable that spaces between adjacent feeding openings 24 be the same with one another. Formation of the feeding openings 24 at same intervals makes it possible to evenly feed the first treatment liquid to the approximate boundary. The treatment jig 20 shown in the present embodiment includes a support tube 26 having a cross shape, so that the annular shape of the tube 22 is maintained. In the treatment jig 20 of the present embodiment, the support tube 26 is in communication with the feeding pipe 32 at an approximate center, and as such, the treatment liquid is fed to the tube 22 via the support tube 26.

Further, the nozzle 46 is in communication with the feeding pipe 42. The second treatment liquid is fed to the second treatment surface via the nozzle 46. It is preferable that the nozzle 46 be provided at such a position as to allow the second treatment liquid to be fed to an approximate center of the second treatment surface 18b. This is because provision of the nozzle 46 at the above position makes it possible to evenly spread the second treatment liquid over the second treatment surface 18b.

The treatment jig 20 is not limited to the above arrangement as long as the first treatment liquid can be fed to the approximate boundary between the first and the second treatment surfaces 18a, 18b. One example of a treatment jig 80 in accordance with another embodiment is described with reference to FIG. 3. (a) of FIG. 3 is a cross sectional view explaining the treatment jig 80 in detail. (b) of FIG. 3 is a plane view showing the treatment jig 80 from a treatment object 18.

As shown in (a) and (b) of FIG. 3, the treatment jig 80 of another embodiment includes plural tubes 82 radially extending from a center section 81, and nozzles 46. Each of the tubes 82 is in communication with a feeding pipe 32 at one end, and attached with a nozzle 84 at the other end. A first treatment liquid is fed to an approximate boundary between first and second treatment surfaces 18a, 18b via the nozzle 84. In the treatment jig 80 shown in FIG. 3, a tube having an L shape is used as the tube 82. Specifically, the tube 82 has a shape that is combination of tubes, one of which extends in parallel with a second treatment surface 18b, from a center section 81 to a region corresponding to the approximate boundary between the first and the second treatment surfaces 18a, 18b, and the other of which extends in a direction orthogonal to the second treatment surface 18b, from the region corresponding to the approximate boundary between the first and the second treatment surfaces 18a, 18b. It is arranged such that the second treatment surface 18b and the center section 81 substantially overlap each other. The nozzle 84 is provided at a position that is set as appropriate based on a position where the boundary between the first and the second treatment surfaces 18a, 18b is formed. The number of the tubes 82 is set as appropriate based on a size of the second treatment surface 18b. Note that a second feeding section can be arranged in the same way as described earlier.

Further, the first treatment liquid is fed from the treatment jig 20 or 80 to the treatment object at an angle that can be arbitrarily set. The angle can be adjusted by adjusting (i) a position at which a feeding opening is formed or a position at which a nozzle is provided to a tube of a treatment jig and (ii) a pressure of the first treatment liquid to be fed to the tube.

The treatment device 100 of the present embodiment can further include a preparation treatment jig for carrying out preparation treatment to the second treatment surface 18b. A treatment device 110 including a preparation treatment jig will be described with reference to FIG. 4. FIG. 4 is a cross sectional view showing a counterpart of the part A in FIG. 1.

As shown in FIG. 4, the treatment device 110 includes a preparation treatment jig 50, feeding means 60 for feeding a preparation treatment liquid to the preparation treatment jig 50, and collection means 70 for collecting the preparation treatment liquid thus having been fed to the preparation treatment jig 50. FIG. 4 explains, as an example, an arrangement in which the preparation treatment jig 50 and the treatment jig 20 are integrated with each other. In a case where a same treatment liquid is used as a preparation treatment liquid and a second treatment liquid, it is preferable that second feeding means 40 as described earlier be used in the feeding means 60 for feeding the preparation treatment liquid to the preparation treatment jig 50. The following description deals with the case, as an example, where the preparation treatment liquid and the second treatment liquid are the same treatment liquid, and as such, explanation of the feeding means 60 is omitted. Note that, in a case where the second treatment liquid and the preparation treatment liquid are different, on the other hand, the feeding means 60 can be arranged in the same way as the second feeding means 40.

The collection means 70 includes members such as a pump (which is not illustrated) for sucking the preparation treatment liquid from the preparation treatment jig 50, a tank (which is not illustrated) for storing the preparation treatment liquid that has been collected, and the like. The collection means 70 is connected with the preparation treatment jig 50 via a collection pipe 72.

The treatment device 110 including the preparation treatment jig 50 includes separation maintaining means 76 for maintaining separation between the preparation treatment jig 50 and a treatment object 18.

A concrete arrangement of the preparation treatment jig 50 will be described below. The preparation treatment jig 50 includes a treatment section 52 for retaining the preparation treatment liquid that has been fed and thereby carrying out treatment to the treatment object 18b. The treatment section 52 includes a facing surface 52a on the preparation treatment jig 50, which facing surface 52a faces a treatment surface 18a. As such, with the preparation treatment jig 50, it is possible to retain the treatment liquid in a space formed by the treatment section 52 and the facing surface 52a.

The treatment section 52 has a first through hole 56 and a second through hole 58. The first through hole 56 is a hole via which the preparation treatment liquid is fed to the treatment section 52, and the second through hole 58 is a hole via which the preparation treatment liquid thus fed to the treatment section 52 is collected. Thus, the preparation treatment jig 50 is capable of feeding the treatment liquid to the second treatment surface 18b while collecting the treatment liquid that has been fed to the second treatment surface 18b. As such, the preparation treatment liquid is retained between the facing surface 52a and the second treatment surface 18b. This makes it possible to carry out the preparation treatment to the second treatment surface 18b in such a manner that the second treatment liquid is prevented from being spattered to a part other than the second treatment surface 18b.

The number of the first through holes and that of the second through holes can be set as appropriate based on the treatment object. Each of the first through holes and that of the second through holes are provided at positions that can be set as appropriate based on the treatment object, respectively. A cross sectional shape of a first through hole 56 and a second through hole 58 can be a circular shape, an elliptic shape, or a rectangular shape. Neither the first through hole 56 nor the second through hole 58 is particularly limited in its cross sectional shape as long as a flow of the treatment liquid is not obstructed. Likewise, neither the first through hole 56 nor the second through hole 58 is limited in a diameter or the number as long as the flow of the treatment liquid is not obstructed.

Further, it is preferable that the treatment section 52 include a protrusion section 54, which protrudes from the facing surface 52a toward the treatment object 18. It is preferable that the protrusion section 54 be provided on an edge part of the facing surface 52a. Use of the treatment section 52 including the protrusion section 54 makes it possible to retain the fed treatment liquid between the treatment section 52 and the treatment surface 18b with higher certainty. The treatment liquid is retained between the treatment section 52 and the treatment surface 18b due to a surface tension.

The separation maintaining means 76 keeps the separation between the surface treatment jig 50 and the treatment surface 18b to a given distance, and as such, the treatment liquid can be retained between the treatment section 52 and the treatment surface 18b. Besides, the separation maintaining means 76 can have a mechanism capable of moving the surface treatment jig 50 in parallel with and upwardly and downwardly with respect to the treatment surface 18b. Specifically, the separation maintaining means 76 can be realized by a member such as an arm that holds the surface treatment jig 50 or the like.

Further, in a case where both the facing surface 52a of the protrusion section 54 and the second treatment surface 18b are planar, it is preferable that the separation maintaining means 76 keep the distance between the protrusion section 54 and the second treatment surface 18b in a range from 0.5 mm or more to 3 mm or less, more preferably in a range from 0.5 mm to 1.5 mm. The distance between the protrusion section 54 and the treatment surface 18a can be limitlessly close to 0 mm as long as they are not in contact with each other. This makes it possible to retain the preparation treatment liquid with certainty.

It is preferable that an area to which the treatment section 52 of the preparation treatment jig 50 carries out the treatment be smaller as compared to the second treatment surface 18b. With reference to FIG. 5, the following description deals with two examples of a cross sectional shape of the preparation treatment jig 50. The preparation treatment jig 50 has the cross sectional shape whose shape is substantially the same as the region treatable by the treatment section 52. Note that the treatment jig 20 is not illustrated in FIG. 5. (a) of FIG. 5 is a plane view showing a preparation treatment jig 50a in accordance with a first aspect, the preparation treatment jig 50a being provided above a second treatment surface 18b. (b) of FIG. 5 is a plane view showing a preparation treatment jig 50b in accordance with a second aspect.

As shown in (a) of FIG. 5, the preparation treatment jig 50a of the first aspect has a cross sectional surface of a circular shape. The preparation treatment jig 50a has a first through hole 56 and a second through hole 58. A treatment liquid is fed to a treatment section of the preparation treatment jig 50a via the first through hole 56, and the treatment liquid having been fed to the treatment section of the preparation treatment jig 50a is collected via the second through hole 58. It is preferable that the preparation treatment jig 50a be used with respect to the treatment object whose second treatment surface 18b has a circular shape. In this case, the separation maintaining means 76 moves the preparation treatment jig 50 in parallel with the second treatment surface 18b, from a part corresponding to an approximate center of the second treatment surface 18b, and thereby, the second treatment surface 18b can be treated. Further, by rotating a treatment object 18 in a direction shown by an arrow, it is possible to carry out the treatment to an entire part of the second treatment surface 18b with ease.

As shown in (b) of FIG. 5, the preparation treatment jig 50b has a cross sectional surface of a rectangular shape with rounded corners. The preparation treatment jig 50b of the second aspect has a first through hole 56 and a second through hole 58, each of which has the same function as its counterpart in the preparation treatment jig 50a. In a case where the second treatment surface 18b has a circular shape, it is preferable that the preparation treatment jig 50b have a cross sectional surface whose length in a longer direction is substantially the same as a radius of a second treatment surface 18b (see (b) of FIG. 5). In this case, it is possible to carry out treatment to an entire part of the second treatment surface 18b by carrying out the treatment while rotating a treatment object in a direction shown by an arrow.

The preparation treatment jig 50 is not limited in the cross sectional shape shown in FIG. 5, as long as the preparation treatment liquid can be (i) fed to and collected form the second treatment surface 18b and (ii) retained between the preparation treatment jig 50 and the second treatment surface 18b. Thus, the preparation treatment jig 50 can have a cross sectional surface of, for example, a rectangular shape. Similarly, neither the first through hole 56 nor the second through hole 58 is limited in a pore shape, a pore diameter, the number, or a position shown in FIG. 5 as long as a flow of the preparation treatment liquid is not obstructed.

The treatment device 110 can be arranged such that a second treatment liquid is fed to a second treatment surface via a second through hole 58a of a preparation treatment jig 50. This allows downsizing of a treatment device.

The treatment device 100 of the present embodiment includes the treatment jig 20 that includes the first feeding section for feeding the first treatment liquid to the approximate boundary between the first the second treatment surfaces 18a, 18b, and the second feeding section for feeding the second treatment liquid to the second treatment surface 18b. The first treatment liquid thus fed to the approximate boundary covers and thereby protects the first treatment surface 18a. Thus, even when the second treatment liquid fed to the second treatment surface 18b reaches the first treatment surface 18a, influence by the second treatment liquid on the first treatment surface 18a can be reduced. As a result, with respect to the treatment object 18 that includes the first treatment surface 18a and the second treatment surface 18b for each of which the independent treatment condition is required, the treatment device 100 of the present embodiment makes it possible to carry out the treatment that meets each treatment condition. Further, because the treatment object 18 can be rotated, it is possible to outwardly spread the first and the second treatment liquids on the treatment object 18 due to the centrifugal force. This makes it possible to carry out the treatment to the treatment object with high efficiency.

Further, the treatment device 110 includes the preparation treatment jig 50 capable of carrying out the treatment to the second treatment surface 18b. In this case, it is possible to carry out the preparation treatment to the second treatment surface 18b by use of the preparation treatment jig 50. This makes it possible to carry out efficient treatment.

(Treatment Method)

A treatment method of the present embodiment is described next. The following description deals with a case where the treatment method of the present embodiment is carried out by use of the aforementioned treatment device. However, the present embodiment is not limited to use of the treatment device.

A treatment object that is suitably treated based on the treatment method of the present embodiment includes a treatment surface that includes a second treatment surface 18b having a circular shape and a first treatment surface 18a surrounding the second treatment surface 18b. According to treatment of the present embodiment, a treatment object 18 is placed on a table section 10 at first. The table section 10 has a suction mechanism, and thus is capable of holding the treatment object 18. The following explains the treatment in accordance with the present embodiment by exemplifying a case where the treatment includes two steps.

(a) Preparation Treatment Step

According to the treatment method of the present embodiment, the second treatment surface 18b is treated with preparation treatment at first. It is preferable that the preparation treatment be carried out by use of the aforementioned preparation treatment jig 50. First, the preparation treatment jig 50 is provided above the treatment object 18 by use of separation sustention means 76, and held at such a position that maintains a given distance between the preparation treatment jig 50 and the treatment object 18. At this time, it is preferable that the preparation treatment jig 50 be held at such a position that keeps the distance between a treatment section 52 of the preparation treatment jig 50 and the second treatment surface 18b to 3 mm or less. This makes it easier to retain the treatment liquid between the facing surface 52a of the preparation treatment jig 50 and the second treatment surface 18b.

Then, the treatment liquid is fed from a feeding section 60 to the preparation treatment section 50 (the treatment section 52). In feeding of the treatment liquid, a preparation treatment liquid is fed via a first through hole 56 of the preparation treatment jig 50. While the preparation treatment liquid is newly fed, collection means 70 collects the preparation treatment liquid that has been fed (hereinafter, referred to as a "feeding and collection process"). Collection of the preparation treatment liquid is carried out by sucking the preparation treatment liquid into a collection pipe via a second through hole 58 of the preparation treatment jig 50. The preparation treatment liquid can be retained due to its surface tension occurring between the second treatment surface 18b and the preparation treatment jig 50. In this view, a feeding amount and a collection amount of the treatment liquid in the feeding and collection process should be adjusted in a range that allows retention of the surface tension and prevention of spreading of the treatment liquid from the surface treatment jig 20. For example, the feeding and the collection amount of the treatment liquid should be adjusted to a same amount.

The feeding and collecting process of the treatment liquid can be carried out while the preparation treatment jig 50 is moved in parallel with the second surface 18b. In this case, it is preferable that the preparation treatment jig 50 be outwardly moved from a part corresponding to an approximate center of the second treatment surface 18b toward an outer edge of the second treatment surface 18b. This makes it possible to carry out the treatment to an entire part of the second treatment surface 18b, even when the treatment section 52 of the preparation treatment jig 50 has a treatment surface whose area is smaller than the second treatment surface 18b.

Further, the feeding and collecting process can be carried out while the treatment object 18 is rotated around a normal line passing through an approximate center of a surface of the treatment object 18. In this case, it is preferable that a rotating speed of the treatment object 18 fall in a range from 10 rpm or more to 100 rpm or less. In a case where the treatment object 18 is rotated at a rotating speed within the range, the preparation treatment liquid can be retained between the treatment section 52 and the second surface 18b, thereby making it possible to prevent the preparation treatment liquid from spreading into a region other than the second treatment surface 18b. Besides, rotation of the treatment object 18 reduces a time required for the preparation treatment, and as such, efficiency can be improved. The preparation treatment step is effective in a case where the second treatment surface 18b particularly needs to be treated more as compared to the first treatment surface 18a. However, in a case where it is sufficient that solely the final treatment step be carried out, the preparation treatment step may not be necessarily carried out.

The treatment method may further include a suction step after the preparation treatment step so that a residual of the treatment liquid on the treatment object can be removed. The suction step can be realized by an arrangement that involves, for example, use of a pump or the like so as to suck a preparation treatment liquid via a nozzle.

(b) Final Treatment Step

Subsequently, final treatment, which is finishing treatment, is carried out to the treatment object 18 that has been finished with the preparation treatment step. The final treatment step can be carried out by use of a treatment jig 20. The final treatment step includes treating the second treatment surface 18b with the second treatment liquid in a state that the first treatment surface 18a has been covered by the first treatment liquid. Specifically, in the state that the treatment object is rotated, the second treatment liquid is fed to the second treatment surface 18b while the first treatment liquid is fed to the approximate boundary between the first and the second treatment surfaces 18a, 18b. Hereinafter, feeding of the first treatment liquid to the approximate boundary between the first and the second treatment surfaces 18a, 18b is referred to as "first feeding", and feeding of the second treatment liquid to the second treatment surface 18b is referred to as "second feeding".

In the first feeding, the first treatment liquid thus fed to the approximate boundary between the first and the second treatment surface 18a, 18b is outwardly spread, i.e., the first treatment liquid is spread toward the entire surface of the first treatment surface 18a, due to the centrifugal force caused by the rotation of the treatment object 18. This causes the first treatment surface 18a to be covered by the first treatment liquid. That is, the first treatment surface 18a is covered by a coat made of the first treatment liquid. In the second feeding, on the other hand, the second treatment liquid thus fed to the second treatment surface 18b is outwardly spread from a position to which it has been fed, due to the centrifugal force caused by the rotation of the treatment object 18, such that the second treatment liquid reaches the first treatment surface 18a. However, because the first treatment surface 18a has been covered by the first treatment liquid, the second treatment liquid is prevented from being in direct contact with the first treatment surface 18a. Thus, influence of the second treatment liquid, such as a deterioration or the like, is reduced.

In the final treatment step, it is preferable that the first feeding be carried out first, and after the first surface 18a has been covered by the first treatment liquid, the second feeding be carried out. This makes it possible to protect the first treatment surface with certainty.

Further, in the final treatment step, it is preferable that the first feeding be finished after the second feeding has been finished. More preferably, a residual of the second treatment liquid on the second treatment surface 18b should be removed after the second feeding has been finished, and then, the first feeding is finished. Removal of the second treatment liquid left on the second treatment surface is carried out by rotating the treatment object so that the residual of the second treatment liquid is outwardly spread to the outer edge of the treatment object 18 and then thrown of the treatment object 18, due to the centrifugal force. In the arrangement, because the first feeding is continued even after the second feeding has been finished, the first treatment surface 18a is protected by the first treatment liquid. This makes it possible to reduce the influence on the first treatment surface, which influence is caused by the residual of the second treatment liquid on the second treatment surface 18b. Thus, it is possible, depending on a component of the second treatment liquid, to prevent a deterioration of the first treatment surface 18a to be caused by the second treatment liquid.

The final treatment step may include feeding a third treatment liquid different from the second treatment liquid to the second treatment surface 18b after the second feeding has been finished and before the first feeding is finished, so that the second treatment surface is treated with the third treatment liquid. For example, it is preferable that a treatment liquid having a higher volatility than the second treatment liquid is used as the third treatment liquid, because use of such a treatment liquid can improve dehydration of the treatment object. Besides, it is preferable that the rotation of the treatment object be continued even after feeding of the first through the third treatment liquids has been finished. This makes it possible to dehydrate the treatment object 18 with efficiency.

Treatment liquids insoluble to each other can be used as the first and the second treatment liquids, respectively, or treatment liquids soluble to each other can be used as the first and the second treatment liquids, respectively. In a case where the treatment liquids insoluble to each other are used as the first and the second treatment liquids, respectively, the second treatment liquid is moved along a coat formed of the first treatment liquid and spread out of an outer edge of the treatment object, thereby making it possible to prevent the influence of the second treatment liquid on a first treatment surface 18*a*, such as a damage or the like. On the other hand, in a case where the treatment liquids soluble to each other are used as the first and the second treatment liquids, respectively, the second treatment liquid is diluted on the first treatment surface 18*a* by the first treatment liquid. Dilution of the second feeding liquid by the first treatment liquid makes it possible to reduce influence of the second treatment liquid on the first treatment surface 18*a*. With the steps thus described, it is possible to treat the treatment object 18 based on the treatment method of the present embodiment.

The treatment method of the present embodiment makes it possible to carry out suitable treatment to the treatment object 18 including plural treatment surfaces (the first treatment surface 18*a* and the second treatment surface 18*b*) for each of which an independent treatment condition is required.

An example of the treatment object that is treated based on the treatment method of the present invention with particular suitability will be described next. It is obvious, however, that the treatment object 18 is not limited to the example described below.

The treatment object 18, which is suitably treated based on the treatment method of the present embodiment, is a semiconductor wafer that is placed on a dicing tape and then thinned. In a thinning process of the semiconductor wafer, some of an adhesive agent may be left on the semiconductor wafer that has been thinned in the above way. For removal treatment of such a residual of the adhesive agent on the semiconductor wafer, the treatment device of the present embodiment can be used.

In the following description, a thinning process of the semiconductor wafer will be described with reference to FIGS. 6 and 7 at first, and then, an advantage to be brought about by use of the treatment method of the present embodiment will be described. (a) through (d) of FIG. 6 are cross sectional views each explaining the thinning process of the semiconductor wafer. FIG. 7 is a plane view of the treatment object 18 that has been produced based on the thinning process. The following deals with an example in which a porous support plate 90 is used.

As shown in (a) of FIG. 6, the porous support plate 90 and the semiconductor wafer 94*a* are combined to each other via an adhesive agent 92 at first. The semiconductor wafer 94*a* has not been thinned yet at this point. Subsequently, as shown in (b) of FIG. 6, the semiconductor wafer 94*a* is grinded so as to produce a semiconductor wafer 94 having a thin film thickness. Grinding of the semiconductor wafer 94*a* can be carried out based on any of well-known techniques. Then, as shown in (c) of FIG. 6, a dicing tape (supporter) is adhered to a surface of the semiconductor wafer 94 to which surface the adhesive agent 92 is not applied. The dicing tape 96 is provided so that the semiconductor wafer 94 is strengthened even after being removed from the porous support plate 90. As such, provision of the dicing tape 96 makes it possible that the semiconductor wafer 94 be treated with ease. A dicing frame (fixing tool) 98 is provided so as to surround the dicing tape 96, and prevents loosening of the dicing tape 96. After the semiconductor wafer 94 and the dicing tape 96 has been combined to each other, a solvent for solving the adhesive agent 92 is fed via holes in the porous support plate 90. After the adhesive agent 92 has been solved, the support plate 90 is removed. However, the adhesive agent 92 may not be completely solved, and as such, some of the adhesive agent 92 is left on the semiconductor wafer 94. As shown in (d) of FIG. 6, a residual of the adhesive agent 92 is shown by a residual adhesive agent 93. As such, a laminated product of the semiconductor wafer 94, on which the residual adhesive agent 93 is left, and the dicing tape 96 constitutes the treatment object 18.

FIG. 7 is a plane view of the treatment object 18 thus produced. As shown in FIG. 7, the semiconductor wafer 94 on which the residual adhesive agent 93 is left corresponds to a second treatment surface 18*b*, and the dicing tape 96 surrounding the semiconductor wafer 94 corresponds to a first treatment surface 18*a*.

The dicing tape 96 may be deteriorated when being in contact with the solvent (a treatment liquid) used in removal of the residual adhesive agent 93. A deterioration of the dicing tape 96 causes the dicing tape 96 to be loosened. Then, loosening of the dicing tape 96 may cause a crack in the semiconductor wafer 94 whose strength has been decreased due to the thinning process. In this view, it is required to remove the residual adhesive agent 93 on the semiconductor wafer 94 without causing the deterioration of the dicing tape 96. That is, it is required to carry out treatment to the treatment object that includes plural treatment surfaces for each of which independent treatment is required.

In a case where the treatment method of the present embodiment is used in the removal of the residual adhesive agent 93 on the semiconductor wafer 94, the solvent (second treatment liquid) for solving the adhesive agent on the semiconductor wafer 94 is fed to the semiconductor wafer 94 while a purified water (first treatment liquid) serving as the first treatment liquid is fed to an approximate boundary between the semiconductor wafer 94 and an exposed surface of the dicing tape 96. This makes it possible to carry out protection treatment to the exposed surface of the dicing tape 96 so that the exposed surface of the dicing tape 96 is covered by the purified water, and removal treatment to the semiconductor wafer 94 such that the residual adhesive agent is removed. As such, it is possible to carry out good removal of the residual adhesive agent 93 without causing the deterioration of the dicing tape 96.

Further, as described earlier in explanation of the treatment method of the present embodiment, it is possible to carry out the removal process of the residual adhesive agent 93 with high efficiency by treating the treatment object shown in FIGS. 6 and 7 with the treatment that includes the final treatment step and the preparation treatment step. This is because the removal of the residual adhesive agent on the semiconductor wafer 94 during the preparation treatment step allows reduction in a feeding amount of the solvent (the second treatment liquid) to be fed during the final treatment step.

For treatment of the treatment object 18 shown in FIGS. 6 and 7, it is preferable to use a purified water as the first treatment liquid and a hydrophilic solvent or a hydrophobic solvent as the second treatment liquid. An alcohol such as an alkali solution, ethanol, isopropyl alcohol (IPA), or the like can be used as the hydrophilic solvent. On the other hand, propylene glycol mono methyl ether acetate (PGMEA) can be used as the hydrophobic solvent.

As described above, the treatment method of the present embodiment makes it possible to carry out good removal of the residual adhesive agent 93, the residual adhesive agent 93 having been formed in a manufacturing step of the semiconductor wafer 94 having a thin film thickness. Above explanation of the treatment method of the present embodiment is made with respect to the example in which the treatment method includes the preparation treatment step and the final treatment step. However, the treatment method of the present embodiment is not limited to this. It may be sufficient, depending on the content of treatment required for the treatment object 18, that solely treatment corresponding to the final treatment step be carried out.

EXAMPLES

Examples 1 through 8 and Comparative Examples 1 through 3

Examples and Comparative Examples of the treatment method of the present embodiment are explained below. In each of present Examples, a treatment object was prepared by attaching an 8-inch wafer to a dicing tape, the dicing tape made from a polyolefin and tightened by a dicing frame, via an adhesive agent that was made from an acrylic resin and applied on the 8-inch wafer. Detailed description of the treatment object is provided as follows.

While being rotated, the treatment object was treated by use of any one of three types of treatment jigs. A first treatment jig was a treatment jig that corresponds to the treatment jig 20 as described earlier and has 8 holes in a tube for feeding a first treatment liquid. A second treatment jig was a treatment jig that corresponds to the treatment jig 80 as described earlier and includes 4 nozzles. A third treatment jig was a treatment jig that includes 2 nozzles for feeding the first treatment liquid to the treatment object.

In Example 1, the treatment object was treated by use of the first treatment jig. In Example 2, the treatment object was treated by use of the second treatment jig. In each of Examples 3 through 8, the treatment object was treated by use of the third treatment jig. In each of Comparative Examples 1 through 3, the treatment object was treated with a second treatment liquid only. Besides, in each of Examples 3 through 5, the first treatment liquid was fed via one nozzle only, whereas in each of Examples 6 though 8, the first treatment liquid was fed via two nozzles.

In a condition that, to each of the treatment jigs, a purified water was fed as the first treatment liquid at a rate of 1000 ml/min and PGMEA was fed as the second treatment liquid at a rate of 150 ml/min, the treatment object was treated for 3 minutes of treatment time. The treatment time is a time period during which feeding of the second treatment liquid was started and then finished while the treatment object was rotated at a rotation speed shown in Table 1. Subsequently, while the first treatment liquid was fed, the treatment object was rotated at a rotating speed of 1000 rpm for 5 seconds. After the feeding of the first treatment liquid had been stopped, the treatment object was further rotated at a rotating speed of 1500 rpm for 30 seconds so as to be dehydrated. In the treatment, the first treatment liquid had been fed before the second treatment liquid was fed, such that a coat made of the first treatment liquid was formed on the dicing tape.

After the treatment object was dehydrated, how much the dicing tape had been loosened was measured. Table 1 shows a measurement result. A loosening amount of the dicing tape corresponds to a distance measured between an original surface of the dicing tape and a loosened surface of the dicing tape.

TABLE 1

|  | Treatment Jig | Rotation Speed of Treatment object | Loosening amount |
|---|---|---|---|
| Example 1 | First treatment jig | 500 rpm | 0.4 mm |
| Example 2 | Second treatment jig | 500 rpm | 1.8 mm |
| Example 3 | Third treatment jig | 250 rpm | 2.0 mm |
| Example 4 | Third treatment jig | 500 rpm | 1.9 mm |
| Example 5 | Third treatment jig | 1000 rpm | 2.3 mm |
| Example 6 | Third treatment jig | 250 rpm | 1.9 mm |
| Example 7 | Third treatment jig | 500 rpm | 1.9 mm |
| Example 8 | Third treatment jig | 1000 rpm | 2.2 mm |
| Comparative Example 1 | No treatment jig used | 250 rpm | 5.8 mm |
| Comparative Example 2 | No treatment jig used | 500 rpm | 6.0 mm |
| Comparative Example 3 | No treatment jig used | 1000 rpm | 5.0 mm |

As is clear from Table 1, it was found that the dicing tape loosened much lesser in each of Examples 1 through 8 as compared to Comparative Examples 1 through 3. Also, it was found that the residual adhesive agent on the semiconductor wafer was removed in each of Examples 1 through 8 and that of Comparative Examples 1 through 3. From these findings, it was confirmed that with the treatment method of the present invention, it is possible to treat the semiconductor wafer with the treatment liquid while protecting the dicing tape. Detection of the residual adhesive agent was carried out through measurement by FT-IR.

The present invention is not limited to thus described arrangements. Instead, the arrangements may be applied in many variations, provided that such variations do not exceed the scope of the patent claims as set forth below. An embodiment based on a proper combination of technical means disclosed in different embodiments is encompassed in the technical scope of the present invention.

With respect to the treatment object that includes the second treatment surface and the first treatment surface surrounding the second treatment surface, the treatment device of the present invention includes the treatment jig including the first feeding section for feeding the first treatment liquid to the approximate boundary between the first and the second treatment surfaces and the second feeding section for feeding the second treatment liquid to the second treatment surface, and is thereby capable of treating the first and the second treatment surfaces with independent treatments, respectively.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

A treatment device of the present invention is usable in a cleansing device or an application device, each involving use of a treatment liquid.

The invention claimed is:
1. A treatment device for carrying out treatment to a treatment object whose treatment surface includes a second treat- ment surface and a first treatment surface surrounding the second treatment surface, the treatment device comprising:

a table section for placing the treatment object thereon;

a treatment nozzle that includes a first feeding section for feeding a first treatment liquid to an approximate boundary between the first and the second treatment surfaces, and a second feeding section for feeding a second treatment liquid to the second treatment surface; and a preparation treatment nozzle for carrying out preparation treatment to the second treatment surface, the preparation treatment nozzle having a treatment section having a surface facing the treatment object, a plurality of through-holes in the treatment section extending through the surface, and a protrusion only on an edge part of the surface, wherein at least one of the plurality of through-holes is a hole via which a treatment solution is collected and another at least one of the plurality of through-holes is a hole via which the treatment solution is fed.

2. The treatment device as set forth in claim 1, wherein the table section comprises rotation means for rotating the treatment object.

3. The treatment device as set forth in claim 1 for carrying out the treatment to the treatment object whose second treatment surface has a circular shape, wherein the first feeding section of the treatment nozzle includes a tube of an annular shape, the tube having a feeding opening via which the first treatment liquid is fed.

4. A treatment device as set forth in claim 1, wherein the treatment nozzle comprises plural tubes radially extending from a center section of the treatment nozzle, each of the tubes having a feeding opening in a tip section via which feeding opening the first treatment liquid is fed.

5. The treatment device as set forth in claim 1, wherein the preparation treatment nozzle comprises the treatment section, the treatment section retaining the preparation treatment liquid, which has been fed by feeding means, between the surface of the treatment section facing the treatment object and the second treatment surface and thereby carrying out treatment to the second treatment surface, and being supported by separation maintaining means so as to be held separately from the second treatment surface.

6. The treatment device as set forth in claim 1, wherein the second treatment surface is a surface of a wafer, and the first treatment surface is an exposed surface of a supporter on which the wafer is attached.

7. The treatment device as set forth in claim 1, wherein the protrusion has no through-hole.

* * * * *